(12) United States Patent
Kim et al.

(10) Patent No.: US 7,800,110 B2
(45) Date of Patent: Sep. 21, 2010

(54) THIN FILM TRANSISTOR, DISPLAY DEVICE HAVING THE SAME, AND ASSOCIATED METHODS

(75) Inventors: Moo-Jin Kim, Kyunggi-do (KR); Cheol-Su Kim, Kyunggi-do (KR); Ki-Yong Lee, Kyunggi-do (KR); Kyoung-Bo Kim, Kyunggi-do (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/219,747

(22) Filed: Jul. 28, 2008

(65) Prior Publication Data

US 2009/0101911 A1    Apr. 23, 2009

(30) Foreign Application Priority Data

Aug. 1, 2007    (KR) .................. 10-2007-0077396

(51) Int. Cl.
*H01L 31/036* (2006.01)

(52) U.S. Cl. ................ 257/66; 257/72; 257/411; 438/591

(58) Field of Classification Search ............... 257/411, 257/57, 66, 347, 59, 72; 438/151, 166, 287, 438/591

See application file for complete search history.

(56) References Cited

U.S. PATENT DOCUMENTS

| 3,793,090 | A | * | 2/1974 | Barile et al. | 438/591 |
| 3,974,515 | A | * | 8/1976 | Ipri et al. | 257/353 |
| 5,313,076 | A | * | 5/1994 | Yamazaki et al. | 257/66 |
| 7,470,931 | B2 | * | 12/2008 | Koo et al. | 257/72 |
| 2008/0017937 | A1 | * | 1/2008 | Morimoto et al. | 257/411 |

FOREIGN PATENT DOCUMENTS

KR    10-2006-0035507 A    4/2006

\* cited by examiner

*Primary Examiner*—Mark Prenty
(74) *Attorney, Agent, or Firm*—Lee & Morse, P.C.

(57) ABSTRACT

A thin film transistor (TFT), including a substrate, an active layer and a gate electrode on the substrate, and a first gate insulating layer and a second gate insulating layer between the active layer and the gate electrode. Each of the first gate insulating layer and the second gate insulating layer may have a thickness between approximately 200 Å and approximately 400 Å, inclusive.

19 Claims, 5 Drawing Sheets

THIN FILM TRANSISTOR, DISPLAY DEVICE HAVING THE SAME, AND ASSOCIATED METHODS

BACKGROUND OF THE INVENTION

1. Field of the Invention

Example embodiments relate to a thin film transistor (TFT), a display device having the same, and associated methods. More particularly, example embodiments relate to a TFT having improved electrical characteristics, a display device having the same, and associated methods.

2. Description of the Related Art

An organic light emitting diode (OLED) display, e.g., an active matrix type OLED display, may include a plurality of pixels as units for displaying images. The plurality of pixels may be arranged in a matrix. A TFT may be provided for each pixel as a switching element so as to separately control the pixels.

The TFT may be a polycrystalline silicon, which may be crystallized from an amorphous silicon at high temperature and used as an active layer. The polycrystalline silicon TFT may be affected during a crystallization process of the amorphous silicon and/or during a heat treatment process performed prior to forming a gate insulating layer on the polycrystalline silicon. Accordingly, the polycrystalline silicon TFT may include defects relating to surface or interface characteristics, e.g., dislocation, twin boundary, grain boundary, and dangling bond, which may affect electrical properties of the TFT.

The above information disclosed in this Background section is only for enhancement of understanding of the background of the invention and therefore, it may contain information that does not form the prior art that is already known in this country to a person of ordinary skill in the art

SUMMARY OF THE INVENTION

Example embodiments are therefore directed to a TFT, a display device having the same, and associated methods, which substantially overcome one or more of the problems due to the limitations and disadvantages of the related art.

It is therefore a feature of example embodiments to provide a TFT having improved electrical characteristics by optimizing gate insulating layers, a display device having the same, and associated methods.

At least one of the above and other features of example embodiments may provide a TFT, including a substrate, an active layer and a gate electrode on the substrate, and a first gate insulating layer and a second gate insulating layer between the active layer and the gate electrode. Each of the first gate insulating layer and the second gate insulating layer may have a thickness between approximately 200 Å and approximately 400 Å, inclusive.

A total thickness of the first gate insulating layer and the second gate insulating layer may be approximately 600 Å. The thickness of the second gate insulating layer may be greater than the thickness of the first gate insulating layer. The thickness of the first gate insulating layer may be approximately 200 Å, and the thickness of the second gate insulating layer may be approximately 400 Å.

The first gate insulating layer may include an oxide, and the second gate insulating layer may include a nitride.

The active layer may include polycrystalline silicon including hydrogen bonds. The active layer may have silicon crystals with an average diameter of more than approximately 10 μm.

At least one of the above and other features of example embodiments may provide a display device, including TFT, and an organic light emitting element electrically connected to the TFT having a first electrode, an organic emission layer, and a second electrode. The TFT may include a substrate, an active layer and a gate electrode on the substrate, and a first gate insulating layer and a second gate insulating layer between the active layer and the gate electrodes. Each of the first gate insulating layer and the second gate insulating layer may have a thickness between approximately 200 Å and approximately 400 Å, inclusive.

At least one of the above and other features of example embodiments may be provided by a method of manufacturing a thin film transistor (TFT), the method including forming an active layer on a substrate, forming a first gate insulating layer on the active layer, forming a second gate insulating layer on the first gate insulating layer, and forming a gate electrode on the second insulating layer, wherein each of the first gate insulating layer and the second gate insulating layer are formed to have a thickness between approximately 200 Å and approximately 400 Å, inclusive.

At least one of forming the first and second gate insulating layers may include an oxidation process, and the method may further include performing an annealing process after the oxidation process. Performing the annealing process may include performing annealing under a hydrogen gas atmosphere.

Forming the active layer includes crystallizing an amorphous silicon using solid phase crystallization. The method may further include performing a dehydrogenation process before crystallizing.

BRIEF DESCRIPTION OF THE DRAWINGS

The above and other features and advantages of example embodiments will become more apparent to those of ordinary skill in the art by describing in detail example embodiments thereof with reference to the attached drawings, in which.

DETAILED DESCRIPTION OF THE INVENTION

Figure 1A:
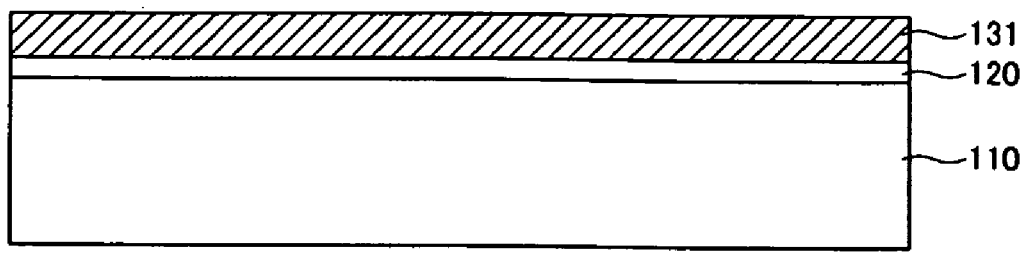
FIG. 1A through FIG. 1H illustrate cross-sectional view of stages in a method of manufacturing a TFT according to an example embodiment.

Korean Patent Application No. 10-2007-0077396 filed on Aug. 1, 2007, in the Korean Intellectual Property Office, and entitled: "Thin Film Transistor and Display Device Having the Same," is incorporated by reference herein in its entirety.

Example embodiments will now be described more fully hereinafter with reference to the accompanying drawings; however, example embodiments may be embodied in different forms and should not be construed as limited to the embodiments set fourth herein. Rather, these example embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An element referred to as "coupled" to another element includes embodiments in which the element is "directly coupled" to another element, as well as embodiments in which the element is "electrically connected" to another element with one or more additional elements interposed therebetween. Furthermore, a unit described as "including" a constituent element may further include other constituent elements in addition to the element, unless specifically referred to the contrary.

FIG. 1A to FIG. 1H illustrates cross-sectional view in stages of a method of are manufacturing a thin film transistor (TFT) according to an exemplary embodiment of the present invention.

Referring to FIG. 1A, a buffer layer 120 may be formed on a substrate 110, and an amorphous silicon layer 131 may be formed on the buffer layer 120. The amorphous silicon layer 131 may be formed via a dehydrogenation process at a temperature of approximately 400° C. to 550° C. The substrate 110 may be made of an insulating material, e.g., glass or plastic, or a conductive material, e.g., metal such as stainless steel. The buffer layer 120 may prevent and/or reduce impurities in the substrate 110 from diffusing into the amorphous silicon layer 131 during crystallization of the amorphous silicon layer 131. The buffer layer 120 may include a silicon nitride (SiN) or may be a multi-layer structure including a SiN layer and a silicon oxide ($SiO_2$) layer.

Since a dehydrogenation process may be performed prior to the crystallization of the amorphous silicon layer 131, hydrogen included in the amorphous silicon layer 131 may be removed in advance. Therefore, defects generated during the crystallization process may be prevented and/or reduced.

Figure 1B:
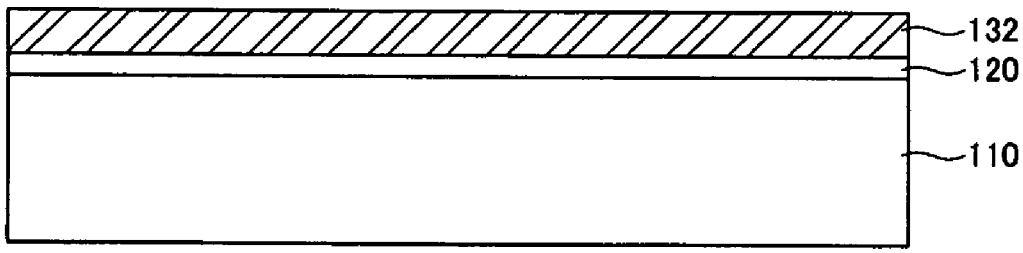

Referring to FIG. 1B, a polycrystalline silicon layer 132 may be formed by crystallizing the amorphous silicon layer 131. The amorphous silicon layer 131 may be crystallized by a solid phase crystallization (SPC) method. The SPC method may include forming the polycrystalline silicon layer 132 by heating the amorphous silicon in the amorphous silicon layer 131 for a predetermined time in a heating apparatus, e.g., a high temperature furnace. For example, since the amorphous silicon layer 131 may be heated while temperature is increased/decreased for a relatively reduced amount of time using a SPC apparatus, the polycrystalline silicon layer 132 may have excellent crystallization characteristics while continuing to maintain the shape of the substrate 110.

Figure 1C:
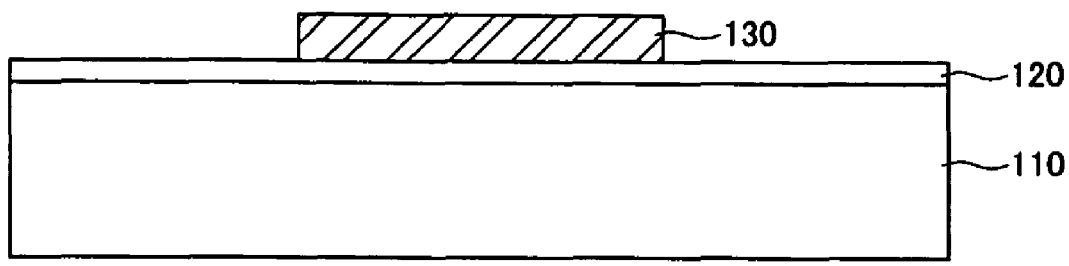

Referring to FIG. 1C, an active layer 130 may be formed by patterning the polycrystalline silicon layer 132 using various processes, e.g., a mask process and an etching process. The active layer 130 may be formed on the buffer layer 120.

Figure 1D:
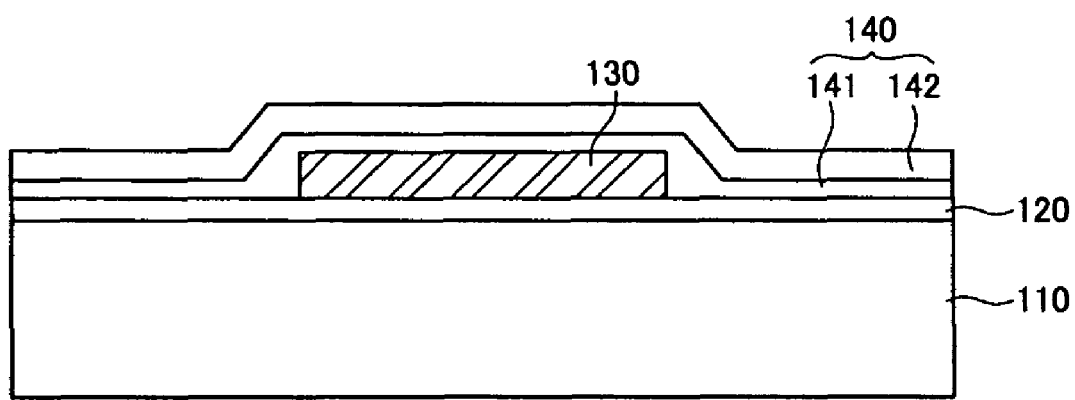

Referring to FIG. 1D, a gate insulating layer 140 may include a first gate insulating layer 141 and a second gate insulating layer 142. The first gate insulating layer 141 and the second gate insulating layer 142 may be sequentially formed over the substrate 110, covering the active layer 130. The gate insulating layer 140 may have a total thickness of approximately less than 600 Å. For example, a thickness of the first gate insulating layer 141 may be approximately 200 Å to approximately 400 Å, and a thickness of the second gate insulating layer 142 may be approximately 200 Å to approximately 400 Å.

The first gate insulating layer 141 may be made of a silicon oxide material, e.g., tetra ethoxy silane (TEOS). The second gate insulating layer 142 may be made of a silicon nitride component, e.g., $SiN_x$. The thickness of the second gate insulating layer 142 may be more than the thickness of the first gate insulating layer 141.

Generally, when a gate insulating layer is formed on an active layer including silicon, e.g., when an oxidation process using TEOS and $SiN_x$ is performed, oxygen atoms in the gate insulating layer may break bonds of silicon atoms included in the surface of the active layer, and may substitute for the silicon atoms. However, a part of valence electrons of silicon atoms can not be combined with electrons of oxygen atoms. Thus, dangling bonds may be formed. The dangling bonds may affect electric characteristics of the TFT, e.g., may increase values of a threshold voltage and deteriorate charge mobility.

To minimize the affect of the dangling bonds, an annealing process may be performed after the formation of the first gate insulating layer 141 and the second gate insulating layer 142. The annealing process may be performed under a hydrogen gas atmosphere, for example, so that hydrogen atoms may bond with the dangling bonds.

When the second gate insulating layer 142 is made of $SiN_x$ and the first gate insulating layer 141 is made of TEOS, the thickness of the second gate insulating layer 142 may be larger than the thickness of the first gate insulating layer 141. Accordingly, there may be more hydrogen atoms in the second gate insulating layer 142, decreasing the thickness of the first gate insulating layer 141. In addition, the hydrogen atoms included in the second gate insulating layer 142 may move to the polycrystalline silicon layer 132 forming the active layer 130 by passing through the first gate insulating layer 141. Further, a hydrogen pressure of a chamber where the annealing process is performed may be reduced, since hydrogen included in the first gate insulating layer 141 may be moved to the polycrystalline silicon layer 132.

Thus, the polycrystalline silicon layer 132 may have excellent crystallization characteristics by varying the thicknesses of the first gate insulating layer 141 and the second gate insulating layer 142. In addition, since the hydrogen atoms may be bonded with electrons forming the dangling bonds, the defects in the polycrystalline silicon layer 132 may be reduced. Further, defects such as dangling bonds in the polycrystalline silicon layer 132 may be reduced so as to form silicon crystals of uniform size, which may be larger than typical silicon crystals. For example, an average size of silicon crystals of the polycrystalline silicon layer 132 may be greater than approximately 10 μm.

Figure 1E:
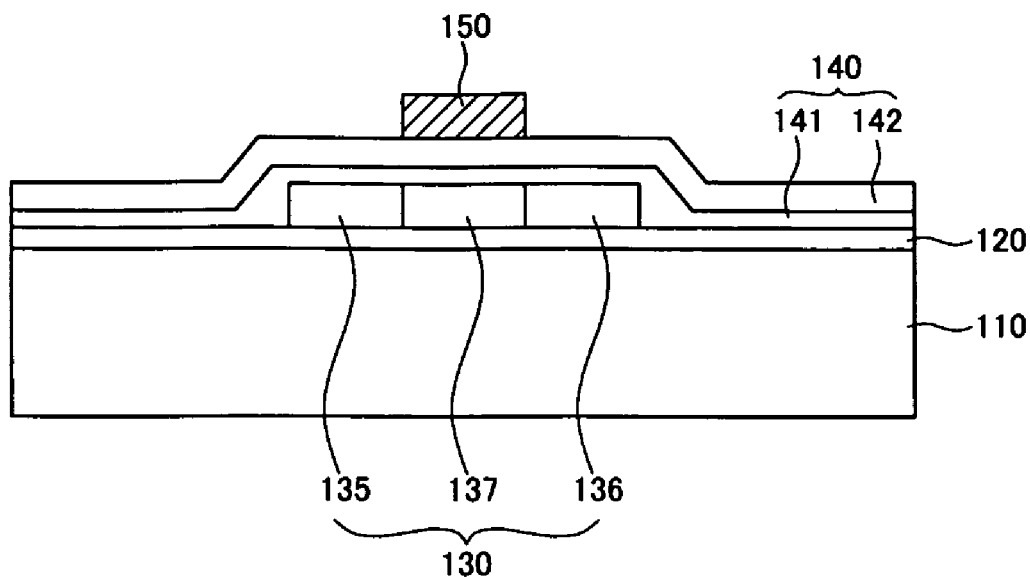

Referring to FIG. 1E, a gate electrode 150 may be formed on the second gate insulating layer 142 corresponding to a center portion of the active layer 130. The gate electrode 150 may be made of metal components, e.g., molybdenum tungsten (MoW), aluminum (Al), chromium (Cr), aluminum/chromium (Al/Cr) or a combination of mixtures thereof. The gate electrode 150 may be formed on the gate insulating layer 140. In particular, the gate electrode 150 may be formed the second gate insulating layer 142.

P-type or N-type impurities may be injected into the active layer 130 to form source and drain regions 135 and 136 at corresponding ends of the active layer 130. An area interposed between the source region 135 and the drain region 136 may function as a channel region 137.

Figure 1F:
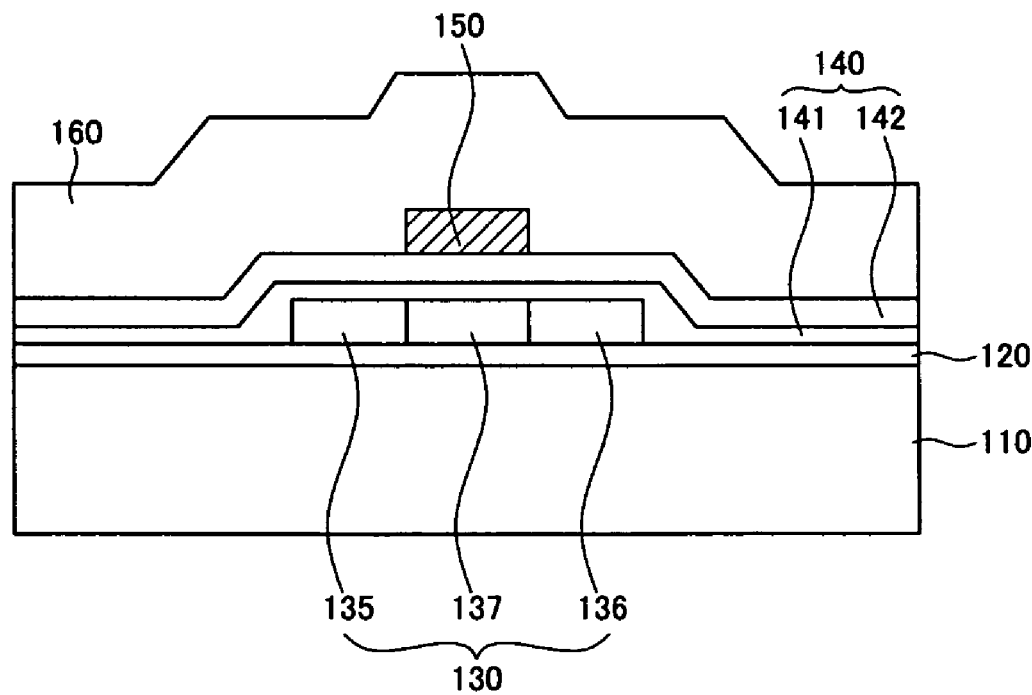

Referring to FIG. 1F, an interlayer insulating layer 160 may be formed over the substrate 110. In particular, the interlayer insulating layer 160 may be formed on the second gate insulating layer 142, including the gate electrode 150.

Figure 1G:
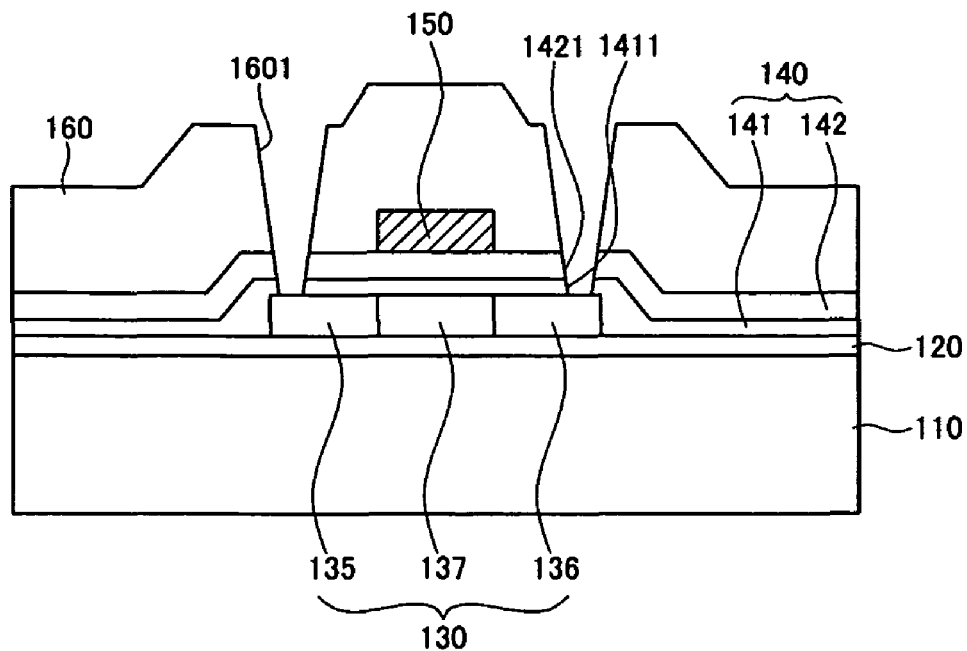

Referring to FIG. 1G, a first contact hole region 1411 may be formed in the first insulating gate layer 141, a second contact hole region 1421 maybe formed in the second insulating gate layer 142, and a third contact hole region 1601 may be formed in the interlayer insulating layer 160 by various processes, e.g., a mask process and an etching process. The source region 135 and the drain region 136 may be exposed through the first, second, and third contact hole regions 1411, 1421, and 1601.

Figure 1H:
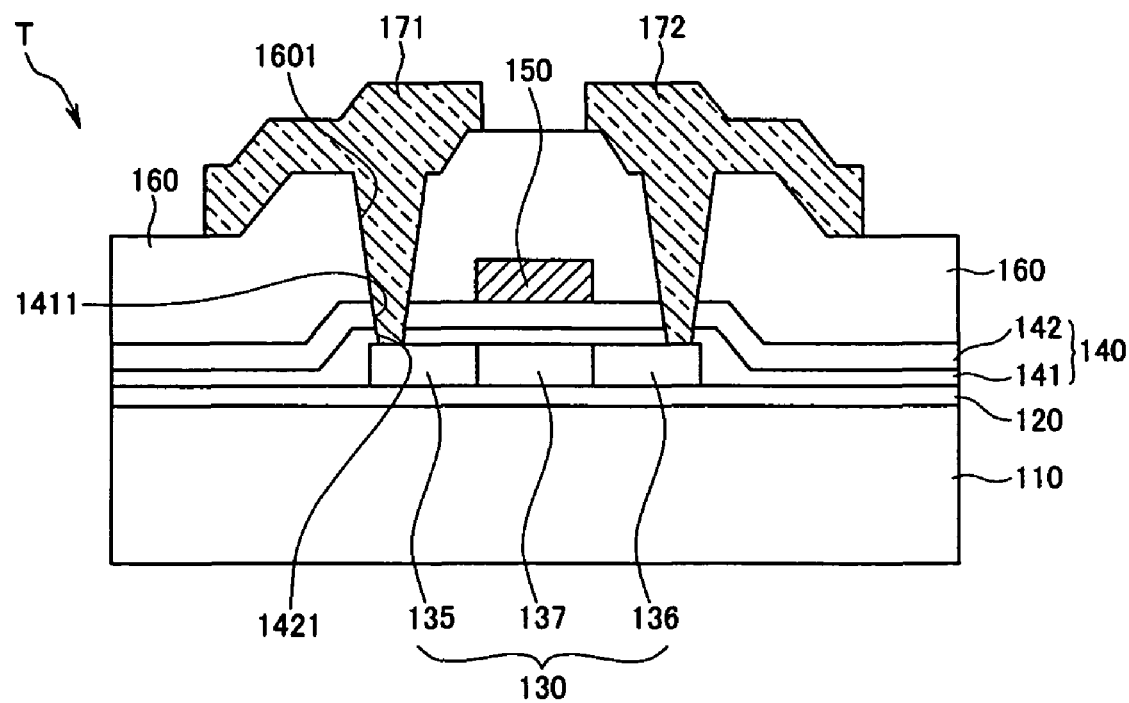

Referring to FIG. 1H, a source electrode 171 and a drain electrode 172 may be formed on the interlayer insulating layer 160. The source and the drain electrodes 171 and 172 may be electrically connected to the source and drain regions 135 and 136, respectively, via the first, second, and third contact hole regions 1411, 1421, and 1601. The source and drain electrodes 171 and 172 may be made of a metal, e.g., titanium/aluminum (Ti/Al) or titanium/aluminum/titanium (Ti/Al/Ti).

Example embodiments will be described by comparing experimental examples to comparative examples. The following examples illustrate the example embodiments in further detail, but it is understood that the example embodiments are not limited by these examples.

Referring to Table 1, the total thickness of the gate insulating layer 140 may be approximately 600 Å, and the thickness of the first gate insulating layer 141 and the second gate insulating layer 142 may be varied as shown in Table 1 in the experimental examples. In an implementation, the first gate insulating layer 141 may be made of TEOS, for example, and the second gate insulating layer 142 may be made of $SiN_x$, for example. In the comparative example, the total thickness of the gate insulating layer 140 may be larger than approximately 600 Å.

TABLE 1

|  | Thickness of the first gate insulating layer | Thickness of the second gate insulating layer |
|---|---|---|
| Experimental example 1 | 400 Å | 200 Å |
| Experimental example 2 | 300 Å | 300 Å |
| Experimental example 3 | 200 Å | 400 Å |
| Comparative example 1 | 400 Å | 400 Å |
| Comparative example 2 | 600 Å | 400 Å |

After manufacturing TFTs including the first gate insulating layer 141 and the second gate insulating layer 142 as shown in the experimental examples 1 to 3 in Table 1, electrical characteristics, e.g., threshold voltage $V_{th}$, charge mobility ($cm^2/Vs$), turn on current $I_{on}$ (A/μm), and S-factor (V/dec), of the TFTs were measured. The measurement results are shown in Table 2 below. Further, in an implementation, width and length of the channel regions 137 of the TFTs may be approximately 10 μm.

TABLE 2

|  | $V_{th}$ (V) | Charge Mobility ($cm^2/Vs$) | $I_{on}$ (A/μm) | S-factor (V/dec) |
|---|---|---|---|---|
| Experimental example 1 | −6.15 | 11.75 | $−0.20 \times 10^{−13}$ | 1.04 |
| Experimental example 2 | −5.29 | 13.38 | $−0.37 \times 10^{−13}$ | 0.97 |
| Experimental example 3 | −4.63 | 16.89 | $−0.68 \times 10^{−13}$ | 0.90 |
| Comparative example 1 | −6.94 | 5.8 | $−0.04 \times 10^{−13}$ | 1.02 |
| Comparative example 2 | −7.83 | 3.39 | $−0.02 \times 10^{−13}$ | 1.14 |

Referring to Table 2, the TFTs made in accordance with the experimental examples 1 to 3 may increasingly possess improved electrical characteristics, e.g., lower threshold voltages and S-factors, and greater charge mobility and turn-on currents. As can be seen with reference to Table 2, the greater the thickness of the second gate insulating layer 142 in comparison to the thickness of the first gate insulating layer 141, the better the electrical characteristics of the TFTs.

On the other hand, the electrical characteristics of the TFTs in comparative examples 1 and 2 may not possess electrical characteristics as good as in experimental examples 1 to 3. For example, the values of the threshold voltage in the comparative examples 1 and 2 are larger, and the charge mobility is weaker, in the comparative examples 1 and 2 than those of the experimental examples 1 to 3.

Figure 2:
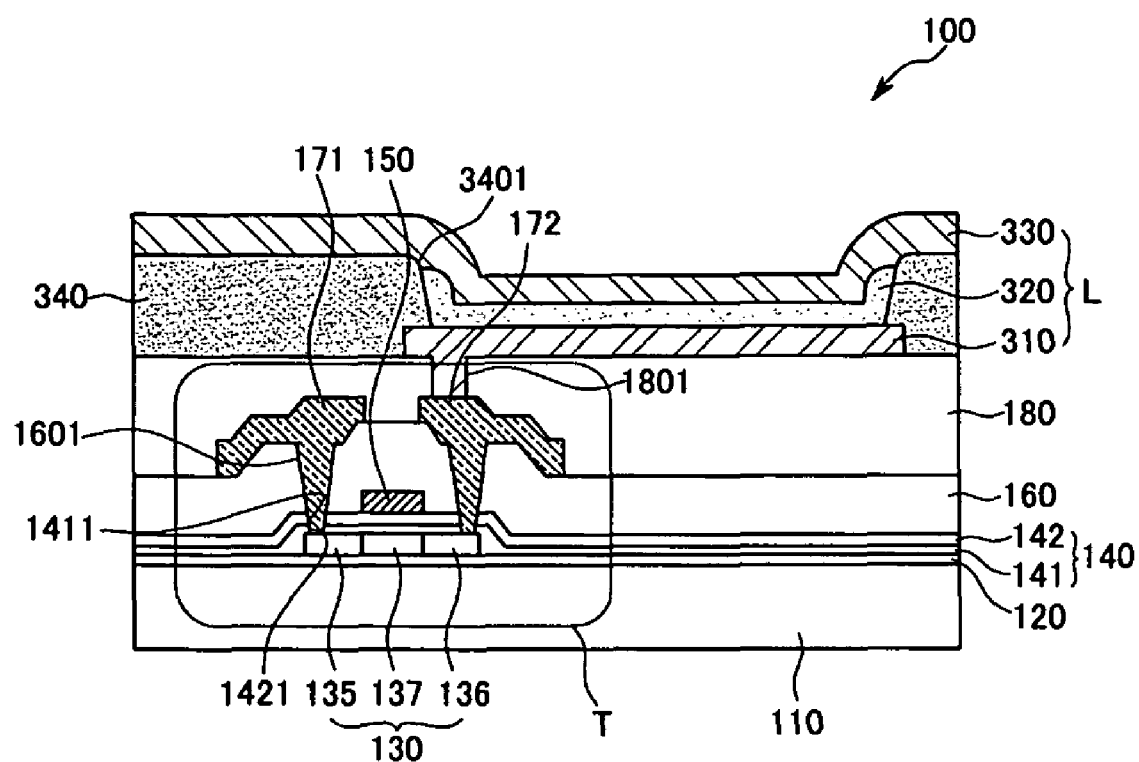
FIG. 2 illustrates a cross-sectional view of an OLED display having the TFT of FIGS. 1A through 1H according to an example embodiment.

FIG. 2 illustrates a cross-sectional view of an OLED display 100 having a TFT T made in accordance with FIGS. 1A-1H according to an example embodiment. Same reference numerals will be used in FIG. 2 for the same constituent elements, and a detailed description will not be repeated for those elements.

Referring to FIG. 2, the OLED display 100 may include an organic light emitting element L electrically connected to the TFT T. A unit pixel may include the organic light emitting element L and the TFT T.

The OLED display 100 may further include a planarization layer 180 interposed between the organic light emitting element L and the TFT T. In particular, the planarization layer 180 may be formed on the interlayer insulating layer 160 covering the TFT T. A first pixel electrode 310, an organic emission layer 320, and a second pixel electrode 330 may be formed on the planarization layer 180, sequentially, to form the organic light emitting element L.

The first pixel electrode 310 may be electrically connected to the drain electrode 172 of the TFT T via a through-hole 1801 formed in the planarization layer 180. A pixel-dividing layer 340 may electrically isolate the first pixel electrode 310 from another adjacent first pixel electrode (not shown). The first pixel electrode 310 may contact the organic light emitting layer 320 through an opening 3401 formed in the pixel-dividing layer 340.

The second pixel electrode 330 may be formed on an entire surface of the substrate 110 to provide a common cathode voltage to the plurality of pixels. For example, the first pixel electrode 310 may inject holes, and the second pixel electrode 330 may inject electrons into the organic light emitting layer 320.

The first pixel electrode 310 may include a first transparent electrode made of, e.g., indium tin oxide (ITO) or indium zinc oxide (IZO). In addition, the first pixel electrode 310 may also include a conductive reflective layer and a second transparent electrode (not shown) according to a light emitting direction of the organic light emitting element L. The conductive reflective layer may reflect light emitted from the organic emission layer 320 to increase luminous efficiency and to improve electrical conductivity. For example, the conductive reflective layer may be made from at least one of aluminum (Al), an aluminum-alloy (Al-alloy), silver (Ag), a silver-alloy (Ag-alloy), gold (Au), and a gold-alloy (Au-alloy). The second transparent electrode may reduce oxidation of the reflective layer and may improve connection between the organic emission layer 320 and the conductive reflective layer. The second transparent electrode may be made of ITO or IZO.

The organic emission layer 320 may include an emission layer (not shown) substantially emitting light. In addition, the organic emission layer 320 may include an organic layer (not shown) formed on and under the emission layer to efficiently transfer a carrier (hole or electron) to the emission layer. For example, the organic layer may include at least one hole injection layer HIL formed between the emission layer and the first pixel electrode 310, an electron transmission layer ETL, and an electron injection layer EIL formed between the emission layer and the second pixel electrode 330.

The second pixel electrode 330 may be made of a transparent conductive layer (not shown) or an opaque conductive layer (not shown) according to the light emitting direction of the organic light emitting element L. When the first pixel electrode 310 is made of the transparent conductive layer, the first pixel electrode 310 may have a thickness of approximately 100 Å to 180 Å. The transparent conductive layer may be made of IZO, ITO, or MgAg, and the opaque conductive layer may be made of Al.

In an implementation, the TFT T of FIG. 2 may serve as a driving device of the OLED display 100. However, the TFT T is not limited to the embodiment as described, and the TFT T may be applied to other display devices, e.g., a liquid crystal display (LCD).

Example embodiments may provide a TFT T having a plurality of gate insulating layers, to improve electrical characteristics of the TFT T.

Example embodiments describes performing a heat treatment process in the gate insulating layer so that hydrogen in an upper layer of the gate insulating layer may pass to a lower layer of the gate insulating layer. Since the hydrogen may be combined with the electrons bonded as dangling bonds in the polycrystalline silicon layer in the gate insulating layer, defects in the polycrystalline silicon crystal may be reduced. In addition, the polycrystalline silicon layer may have crystals of uniform size, may have large silicon crystals, and the electrical characteristics of the TFT T may be improved.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the example embodiments as set forth in the following claims.

What is claimed is:

1. A thin film transistor (TFT), comprising:
   a substrate;
   an active layer and a gate electrode on the substrate, the active layer including polycrystalline silicon that includes hydrogen bonds; and
   a first gate insulating layer and a second gate insulating layer between the active layer and the gate electrode, the first gate insulating layer being between the active layer and the second gate insulating layer, wherein:
   each of the first gate insulating layer and the second gate insulating layer has a thickness between approximately 200 Å and approximately 400 Å, inclusive, and
   the thickness of the second gate insulating layer is greater than the thickness of the first gate insulating layer.

2. The TFT as claimed in claim 1, wherein a total thickness of the first gate insulating layer and the second gate insulating layer is approximately 600 Å.

3. The TFT as claimed in claim 1, wherein the thickness of the first gate insulating layer is approximately 200 Å, and the thickness of the second gate insulating layer is approximately 400 Å.

4. The TFT as claimed in claim 1, wherein the first gate insulating layer includes an oxide, and the second gate insulating layer includes a silicon nitride.

5. The TFT as claimed in claim 1, wherein the active layer has silicon crystals with an average diameter of more than approximately 10 μm.

6. A display device, comprising:
   a thin film transistor (TFT); and
   an organic light emitting element electrically connected to the TFT, the organic light emitting element including a first electrode, an organic emission layer, and a second electrode,
   the TFT including:
   a substrate,
   an active layer and a gate electrode on the substrate, the active layer including polycrystalline silicon that includes hydrogen bonds, and
   a first gate insulating layer and a second gate insulating layer formed between the active layer and the gate electrode, the first gate insulating layer being between the active layer and the second gate insulating layer, wherein:
   each of the first gate insulating layer and the second gate insulating layer has a thickness between approximately 200 Å and approximately 400 Å, inclusive, and
   the thickness of the second gate insulating layer is greater than the thickness of the first gate insulating layer.

7. The display device as claimed in claim 6, wherein a total thickness of the first gate insulating layer and the second gate insulating layer is approximately 600 Å.

8. The display device as claimed in claim 6, the thickness of the first gate insulating layer is approximately 200 Å, and the thickness of the second gate insulating layer is approximately 400 Å.

9. The display device as claimed in claim 6, wherein the first gate insulating layer includes an oxide, and the second gate insulating layer includes a silicon nitride.

10. The display device as claimed in claim 6, wherein the active layer has silicon crystals with an average diameter of more than approximately 10 μm.

11. A method of manufacturing a thin film transistor (TFT), the method comprising:
    forming an active layer on a substrate;
    forming a first gate insulating layer on the active layer;
    forming a second gate insulating layer on the first gate insulating layer; and
    forming a gate electrode on the second insulating layer, wherein:
    each of the first gate insulating layer and the second gate insulating layer are formed to have a thickness between approximately 200 Å and approximately 400 Å, inclusive,
    the second gate insulating layer is formed to be thicker than the first gate insulating layer, and
    the active layer includes polycrystalline silicon that includes hydrogen bonds.

12. The method as claimed in claim 11, wherein at least one of forming the first and second gate insulating layers includes an oxidation process, the method further comprising performing an annealing process after the oxidation process.

13. The method as claimed in claim 12, wherein performing the annealing process includes performing annealing under a hydrogen gas atmosphere.

14. The method as claimed in claim 11, wherein forming the active layer includes crystallizing an amorphous silicon using solid phase crystallization.

15. The method as claimed in claim 14, further comprising performing a dehydrogenation process before crystallizing.

16. The method as claimed in claim 11, wherein forming the first gate insulating layer and forming the second gate insulating layer result in a total thickness of the first gate insulating layer and the second gate insulating layer being approximately 600 Å.

17. A thin film transistor (TFT), comprising:
 a substrate;
 an active layer and a gate electrode on the substrate; and
 a first gate insulating layer and a second gate insulating layer between the active layer and the gate electrode, the first gate insulating layer being between the active layer and the second gate insulating layer, wherein:
  each of the first gate insulating layer and the second gate insulating layer has a thickness between approximately 200 Å and approximately 400 Å, inclusive, and
  the active layer has silicon crystals with an average diameter of more than approximately 10 μm.

18. A display device, comprising:
 a thin film transistor (TFT); and
 an organic light emitting element electrically connected to the TFT, the organic light emitting element including a first electrode, an organic emission layer, and a second electrode,
 the TFT including:
  a substrate,
  an active layer and a gate electrode on the substrate, and
  a first gate insulating layer and a second gate insulating layer formed between the active layer and the gate electrode, the first gate insulating layer being between the active layer and the second gate insulating layer, wherein:
   each of the first gate insulating layer and the second gate insulating layer has a thickness between approximately 200 Å and approximately 400 Å, inclusive, and
   the active layer has silicon crystals with an average diameter of more than approximately 10 μm.

19. A method of manufacturing a thin film transistor (TFT), the method comprising:
 forming an active layer on a substrate;
 forming a first gate insulating layer on the active layer;
 forming a second gate insulating layer on the first gate insulating layer; and
 forming a gate electrode on the second insulating layer, wherein:
  each of the first gate insulating layer and the second gate insulating layer are formed to have a thickness between approximately 200 Å and approximately 400 Å, inclusive, and
  the active layer is formed to have silicon crystals with an average diameter of more than approximately 10 μm, the active layer being formed by crystallizing an amorphous silicon layer.

* * * * *